United States Patent
Eichler et al.

(10) Patent No.: US 7,893,424 B2
(45) Date of Patent: Feb. 22, 2011

(54) SEMICONDUCTOR LAYER STRUCTURE WITH SUPERLATTICE

(75) Inventors: Christoph Eichler, Tegernheim (DE); Alfred Lell, Maxhuette-Haidhof (DE); Andreas Miler, Kaufering (DE); Marc Schillgalies, Regensburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 672 days.

(21) Appl. No.: 11/780,514

(22) Filed: Jul. 20, 2007

(65) Prior Publication Data

US 2008/0054247 A1 Mar. 6, 2008

(30) Foreign Application Priority Data

Jul. 27, 2006 (DE) .................. 10 2006 034 820
Sep. 29, 2006 (DE) .................. 10 2006 046 237

(51) Int. Cl.
*H01L 21/00* (2006.01)

(52) U.S. Cl. .................. 257/13; 257/22; 372/45.012

(58) Field of Classification Search .......... 257/13, 257/22; 372/45.012
See application file for complete search history.

(56) References Cited

U.S. PATENT DOCUMENTS

| | | | |
|---|---|---|---|
| 4,839,899 A | 6/1989 | Burnham et al. | |
| 4,882,734 A | 11/1989 | Scifres et al. | |
| 4,984,242 A * | 1/1991 | Scifres et al. | 372/45.011 |
| 5,027,164 A | 6/1991 | Awano | |
| 5,128,728 A | 7/1992 | Liu | |
| 5,198,682 A | 3/1993 | Wu et al. | |
| 5,319,657 A | 6/1994 | Otsuka et al. | |
| 5,395,793 A | 3/1995 | Charbonneau et al. | |
| 5,497,012 A | 3/1996 | Moll | |
| 5,570,386 A | 10/1996 | Capasso et al. | |
| 5,588,015 A | 12/1996 | Yang | |
| 5,936,989 A | 8/1999 | Capasso et al. | |

(Continued)

FOREIGN PATENT DOCUMENTS

DE 102 13 395 10/2002

(Continued)

OTHER PUBLICATIONS

T. Asano et al., "High-power 400-nm-band AlGaInN-based laser diodes with low aspect ratio", *Applied Physics Letters*, vol. 80, No. 19, pp. 3497-3499 (May 13, 2002).

(Continued)

*Primary Examiner*—Laura M Menz
(74) *Attorney, Agent, or Firm*—Fish & Richardson P.C.

(57) ABSTRACT

The semiconductor layer structure includes a superlattice composed of stacked layers of III-V compound semiconductors of a first and at least one second type. Adjacent layers of different types in the superlattice differ in composition with respect to at least one element, at least two layers of the same type have a different content of the at least one element, the content of the at least one element is graded within a layer of the superlattice, and the layers of the superlattice contain dopants in predefined concentrations, with the superlattice comprising layers that are doped with different dopants. In this way, the electrical, optical and epitaxial properties of the superlattice can be adapted in the best possible manner to given requirements, particularly epitaxial constraints.

10 Claims, 5 Drawing Sheets

U.S. PATENT DOCUMENTS

| | | | |
|---|---|---|---|
| 6,046,464 A | 4/2000 | Schetzina | |
| 6,172,382 B1 | 1/2001 | Nagahama et al. | |
| 6,175,123 B1 | 1/2001 | Kano | |
| 6,455,870 B1 | 9/2002 | Wang et al. | 257/750 |
| 6,489,636 B1 | 12/2002 | Goetz et al. | |
| 6,541,798 B2 | 4/2003 | Koike et al. | |
| 6,617,061 B2 | 9/2003 | Koike et al. | |
| 6,649,942 B2 | 11/2003 | Hata et al. | |
| 6,849,864 B2 | 2/2005 | Nagahama et al. | |
| 6,849,881 B1 * | 2/2005 | Harle et al. | 257/191 |
| 7,106,090 B2 * | 9/2006 | Harle et al. | 324/770 |
| 7,556,974 B2 * | 7/2009 | Harle et al. | 438/22 |
| 7,609,737 B2 * | 10/2009 | Matsumura et al. | 372/43.01 |
| 2001/0028668 A1 | 10/2001 | Fukunaga et al. | |
| 2002/0008245 A1 | 1/2002 | Goetz et al. | |
| 2002/0190259 A1 | 12/2002 | Goetz et al. | |
| 2002/0190263 A1 | 12/2002 | Hata et al. | |
| 2003/0010993 A1 | 1/2003 | Nakamura et al. | 257/99 |
| 2003/0042479 A1 | 3/2003 | Tsuchiya | |
| 2003/0118066 A1 | 6/2003 | Bour et al. | |
| 2003/0178633 A1 | 9/2003 | Flynn et al. | |
| 2003/0197188 A1 | 10/2003 | Watatani et al. | |
| 2003/0235224 A1 | 12/2003 | Ohlander | |
| 2004/0051107 A1 | 3/2004 | Nagahama et al. | |
| 2004/0208213 A1 | 10/2004 | Lichtenstein et al. | |
| 2005/0029506 A1 | 2/2005 | Lee et al. | |
| 2005/0045895 A1 | 3/2005 | Emerson et al. | |
| 2005/0051861 A1 | 3/2005 | Shi et al. | |
| 2005/0056824 A1 | 3/2005 | Bergmann et al. | 257/14 |
| 2005/0116216 A1 * | 6/2005 | Harle et al. | 257/14 |
| 2005/0116261 A1 | 6/2005 | Harle et al. | |
| 2005/0142682 A1 | 6/2005 | Ishibashi et al. | |
| 2005/0151255 A1 | 7/2005 | Ando et al. | 257/750 |
| 2005/0213627 A1 | 9/2005 | Masselink et al. | |
| 2006/0011938 A1 | 1/2006 | Debray et al. | 257/14 |
| 2006/0256825 A1 * | 11/2006 | Matsumura et al. | 372/43.01 |
| 2006/0289854 A1 * | 12/2006 | Harle et al. | 257/14 |
| 2008/0025360 A1 * | 1/2008 | Eichler et al. | 372/45.012 |
| 2008/0049801 A1 * | 2/2008 | Eichler et al. | 372/45.01 |
| 2008/0054247 A1 * | 3/2008 | Eichler et al. | 257/13 |
| 2008/0054252 A1 * | 3/2008 | Eichler et al. | 257/22 |

FOREIGN PATENT DOCUMENTS

| | | |
|---|---|---|
| EP | 0 358 842 | 3/1990 |
| EP | 0 378 919 | 7/1990 |
| EP | 0874403 | 10/1998 |
| EP | 0 881 666 | 12/1998 |
| EP | 1 018 770 | 7/2000 |
| EP | 1 215 781 | 6/2002 |
| EP | 1 220 304 | 7/2002 |
| EP | 1 670 106 | 6/2006 |
| EP | 1 883 140 | 1/2008 |
| EP | 1 883 141 | 1/2008 |
| EP | 1883140 A1 * | 1/2008 |
| EP | 1883141 A1 * | 1/2008 |
| GB | 2 396 054 | 6/2004 |
| JP | 60-145686 | 8/1985 |
| JP | 10-22524 | 1/1998 |
| JP | 11-251684 | 9/1999 |
| JP | 2000-91708 | 3/2000 |
| JP | 2000-244070 | 9/2000 |
| JP | 2008-034850 | 2/2008 |
| JP | 2008-034851 | 2/2008 |
| JP | 2008-034852 | 2/2008 |
| JP | 2008034850 A * | 2/2008 |
| JP | 2008034851 A * | 2/2008 |
| JP | 2008034852 A * | 2/2008 |
| WO | WO 00/58999 | 10/2000 |
| WO | WO 2004/084366 | 10/2004 |
| WO | WO 2006/068376 | 6/2006 |

OTHER PUBLICATIONS

M.Z. Kauser et al., "Enhanced vertical transport in p-type AlGaN/GaN superlattices", *Applied Physics Letters*, vol. 85, No. 22, pp. 5275-5277 (Nov. 29, 2004).

M.Z. Kauser et al., "Optimization of conductivity in p-type GaN/InGaN-graded superlattices", *Journal of Applied Physics*, vol. 97, pp. 083715-1-083715-5 (2005).

Peter Kozodoy et al., "Enhanced Mg doping efficiency in $Al_{0.2}Ga_{0.8}N$/GaN superlattices", *Applied Physics Letters*, vol. 74, No. 24, pp. 3681-3683 (Jun. 14, 1999).

Peter Kozodoy et al., "Polarization-enhanced Mg doping of AlGaN/GaN superlattices", *Applied Physics Letters*, vol. 75, No. 16, pp. 2444-2446 (Oct. 18, 1999).

Kazuhide Kumakura et al., "Increased Electrical Activity of Mg-Acceptors in $Al_xGa_{1-x}N$/GaN Superlattices", *Jpn. J. Appl. Phys.*, vol. 38, pp. L1012-L1014 (1999).

M. Kuramoto et al., "Reduction of Internal Loss and Threshold Current in a Laser Diode with a Ridge by Selective Re-Growth (RiS-LD)", *Phys. stat. sol.*, vol. 192, No. 2, pp. 329-334 (2002).

K.A. Mikhoyan et al., "Formation of a quasi-two-dimensional electron gas in $GaN/Al_xGa_{1-x}N$ heterostructures with diffuse interfaces", *Journal of Applied Physics*, vol. 95, No. 4, pp. 1843-1848 (Feb. 15, 2004).

Guido Steude et al., "Strain Modification of GaN in AlGaN/GaN Epitaxial Films", *Jpn. J. Appl. Phys.*, vol. 38, pp. L498-L500 (1999).

European Search Report for Application Serial No. 07013822.7-2222 dated Oct. 24, 2007.

S. Nakamura et al., "Present status of InaN/GaN/AlGaN-based laser diodes", *Journal of Crystal Growth*, North Holland Publishing Amsterdam, NL, vol. 189-190 (Jun. 15, 1998).

Ting Gang Zhu et al., "AiGaN-GaN UV Light-Emitting Diodes Grown on SIC by Metal-Organic Chemical Vapor Deposition", *IEEE Journal of Selected Topics in Quantum Electronics*, IEEE Service Center, Piscataway, NJ, vol. 8, No. 2 (Mar. 2002).

EP search report, dated Oct. 21, 2008.

European Search Report for Application No. 07013821.9-2222 dated Nov. 12, 2007.

\* cited by examiner

SEMICONDUCTOR LAYER STRUCTURE WITH SUPERLATTICE

CROSS REFERENCE TO RELATED APPLICATIONS

This application claims the benefit of foreign priority applications filed in Germany, serial number 10 2006 034 820.6, filed Jul. 27, 2006, and serial number 10 2006 046 237.8, filed Sep. 29, 2006. The contents of the prior applications are hereby incorporated by reference in their entirety.

BACKGROUND

The invention relates to a semiconductor layer structure [comprising] a superlattice composed of stacked layers of a first and at least one second type, wherein the layers of the first type and the at least one second type are III-V compound semiconductors and adjacent layers of different types in the superlattice differ in composition with respect to at least one element. The invention further relates to an optoelectronic component comprising such a semiconductor layer structure.

SUMMARY

Superlattices containing stacked layers of different types have different electrical, optical and epitaxial properties from a layer of the same thickness that is composed of just one material of one composition. In particular, with a suitable composition and doping, a superlattice composed of alternately stacked p-doped gallium nitride (GaN) and p-doped aluminum gallium nitride (AlGaN) layers may have a higher conductivity than a p-doped pure GaN or AlGaN layer of the same thickness. Due to these properties, superlattices have found numerous applications in electronic and optoelectronic components.

It is an object of the invention to create a semiconductor layer structure with superlattice of the initially cited kind that has improved electrical and optical properties. It is a further object of the invention to specify an optoelectronic component having such a semiconductor layer structure.

This object is achieved in accordance with claim 1 by means of a semiconductor layer structure of the initially cited kind in which at least two layers of the same type within the superlattice have different contents of at least one element, the content of at least one element is graded within a layer of the superlattice, and the layers of the superlattice contain dopants in predefined concentrations, said superlattice comprising layers that are doped with different dopants.

According to the invention, the content of the at least one element with respect to which adjacent layers of different types differ in composition is different in the two layers of the same type, the content of the at least one element is graded within a layer of the superlattice, and the layers of the superlattice contain dopants in predefined concentrations, said superlattice comprising layers that are doped with different dopants.

The electrical, optical and epitaxial properties of the superlattice can thereby be adapted to given requirements in the best possible manner. This applies in particular to epitaxial constraints, to which the superlattice can be adapted.

Requirements on the superlattice frequently are not the same over its entire thickness, for example because physical variables, such as electrical or optical field strength, that influence those requirements also are not constant over the thickness of the superlattice.

For example, the composition within the layers of a type can have an effect on the refractive index, and thus on optical waveguiding; on the size of the band gap, and thus on optical absorption losses; and on the lattice structure and/or lattice constant, and thus on strains exerted on adjacent layers by the superlattice. The dependence of the variables on the content of an element can work against the desired properties of the superlattice, for example in such a way that a high content may well have an advantageous effect on waveguiding by the superlattice and/or advantageously reduce optical absorption losses, but it may also disadvantageously increase strains between adjacent layers.

In such a case, having all the layers of one type be of the same composition can, at best, represent a compromise between the advantages that can be gained and the disadvantages that must be accepted. Conversely, through the use of a composition that varies within a layer type, a graded content of at least one element, and different dopants it becomes possible to accommodate spatially different requirements on the superlattice, and, for example, to provide a different composition and/or different dopants for layers in the edge region of the superlattice, which are determinative of the strain exerted on adjacent layers, than for layers in the middle region of the superlattice, which are determinative with regard to waveguiding because of the spatial extent of that region.

The term "superlattice" basically denotes a structure that exhibits a periodicity in which the period length is greater than the lattice constants of the materials used. In the context of the application, the term "superlattice" is applied to a sequence of stacked layers in which a layer sequence that includes at least two layers of different types repeats in a direction perpendicular to the interfaces between the layers, i.e., for example, in the growth direction of the layers. A superlattice in this sense is constituted, for example, by a sequence of alternately stacked layers of different types, where "alternately" is to be understood as meaning that two or more layers succeed one another by turns. A type can be represented by more than one layer in such a repeating layer sequence. Examples of such superlattices are provided by the following layer sequences: "ab|ab|ab| . . . ", "abc|abc|abc| . . . ", "abcb|abcb| . . . " and "abababbc|abababbc| . . . ", where a, b and c each represent layers of a respective type and the repeating layer sequence is indicated by the separator "|".

In the context of the application, the composition of a layer is defined by elements contained in the layer and by its nominal stoichiometry (i.e., the stoichiometry within the accuracy limits of composition monitoring during or after the growth process), dopants and impurities excluded. The stoichiometry is given by the content (percentage) of individual elements in the layer. In the context of the invention, there is no limit on the number of elements in a layer. The layers of the superlattice can, for example, be elementary, i.e. composed of only one element, or they can be binary, ternary, quaternary, etc.

The type of a layer is determined by the composition of that layer, although this does not necessarily mean that all layers of one type have the same composition. The composition of the layers of one type can vary within the superlattice in a predetermined manner, e.g. in that the concentration of one element in the layers of one type increases from layer to layer of that type. Adjacent layers of different types in the superlattice differ in composition with respect to at least one element, however.

According to advantageous configurations of the semiconductor layer structure, the superlattice comprises alternately stacked $In_xAl_yGa_{1-x-y}N$ and $In_wAl_zGa_{1-w-z}N$ layers, where $0 \leq x,y,w,z \leq 1$ and $x+y \leq 1$ and $w+z \leq 1$, or alternately stacked $In_xAl_yGa_{1-x-y}P$ and $In_wAl_zGa_{1-w-z}P$ layers, where $0 \leq x,y,w,z \leq 1$ and $x+y \leq 1$ and $w+z \leq 1$, or alternately stacked $In_xAl_yGa_{1-x-y}As$ and $In_wAl_zGa_{1-w-z}As$ layers, where $0 \leq x,y,w,z \leq 1$ and $x+y \leq 1$ and $w+z \leq 1$. For one thing, these material systems are very important technologically, and for another, an advantageous increase in conductivity, particularly of hole conduction, can be observed in these systems with the use of a superlattice.

According to a further advantageous configuration of the semiconductor layer structure, the individual layers of the superlattice are each assigned a vertical position within the semiconductor layer structure and the content of at least one element in a layer depends in a predetermined manner on the vertical position of that layer in the semiconductor layer structure. In this way, the superlattice and its properties can be adapted in the best possible manner to spatially different requirements on the superlattice.

According to further advantageous configurations, the dependence of the content of at least one element on vertical position either is defined by a common function for all the layers or is defined by a first function for layers of the first type and by at least one second function for layers of the at least one second type. Particularly preferably, the first and/or the at least one second and/or the common function is a step function or a monotonously rising/falling function or a linear function or a polynomial function or a root function or an exponential function or a logarithmic function or a periodic function or a superposition of the aforesaid functions or contains fractions of one of these functions.

According to a further advantageous configurations [sic], all the layers of the superlattice have the same thickness. According to a further advantageous configurations [sic], layers of different types have different thicknesses.

The object is further achieved by means of an optoelectronic component comprising a semiconductor layer structure of the before-described kind. In optoelectronic components, requirements concerning specific properties of the superlattice often are not spatially constant. A semiconductor layer structure in which layers of the same type do not have the same composition within the superlattice makes it possible to adapt the electrical, optical and epitaxial properties of the superlattice to given requirements in the best possible manner.

According to advantageous configurations of the optoelectronic component, said component comprises an optically active layer, and the at least one element whose content is different in at least two layers of the same type is Al. In this case, the Al content in the superlattice of the semiconductor layer structure increases or decreases with increasing distance from the optically active layer. In an optoelectronic component comprising an optically active layer, a high Al content in a layer of the superlattice that is directly or indirectly adjacent the active layer may cause detrimental strains in the active layer that reduce the quantum efficiency of that layer. Having the Al content in the superlattice decrease in the direction of the active layer makes it possible to reduce losses due to lower quantum efficiency. A high Al content, on the other hand, leads to a larger band gap and thus to lower optical absorption by a layer. Since the intensity of a radiation generated by an active layer increases in the direction of that active layer, an Al content that increases within the superlattice in the direction of the active layer can therefore be advantageous with regard to optical absorption losses.

According to further advantageous configurations, the optoelectronic component is a light-emitting diode or a laser diode.

Further advantageous configurations of the invention will become apparent from the exemplary embodiments described hereinafter in conjunction with the figures.

BRIEF DESCRIPTION OF THE DRAWINGS

Therein:

FIG. 1 provides a schematic illustration in cross section of the layer sequence of a semiconductor layer structure of an optoelectronic component with a superlattice. Grown on a substrate 1 is a matching layer 2, followed by an n-doped contact layer 3. To simplify description, the type of doping used in the layers will be specified below by adding the letter n or p as a prefix, i.e., for example, n-contact layer 3.

Figure 1:
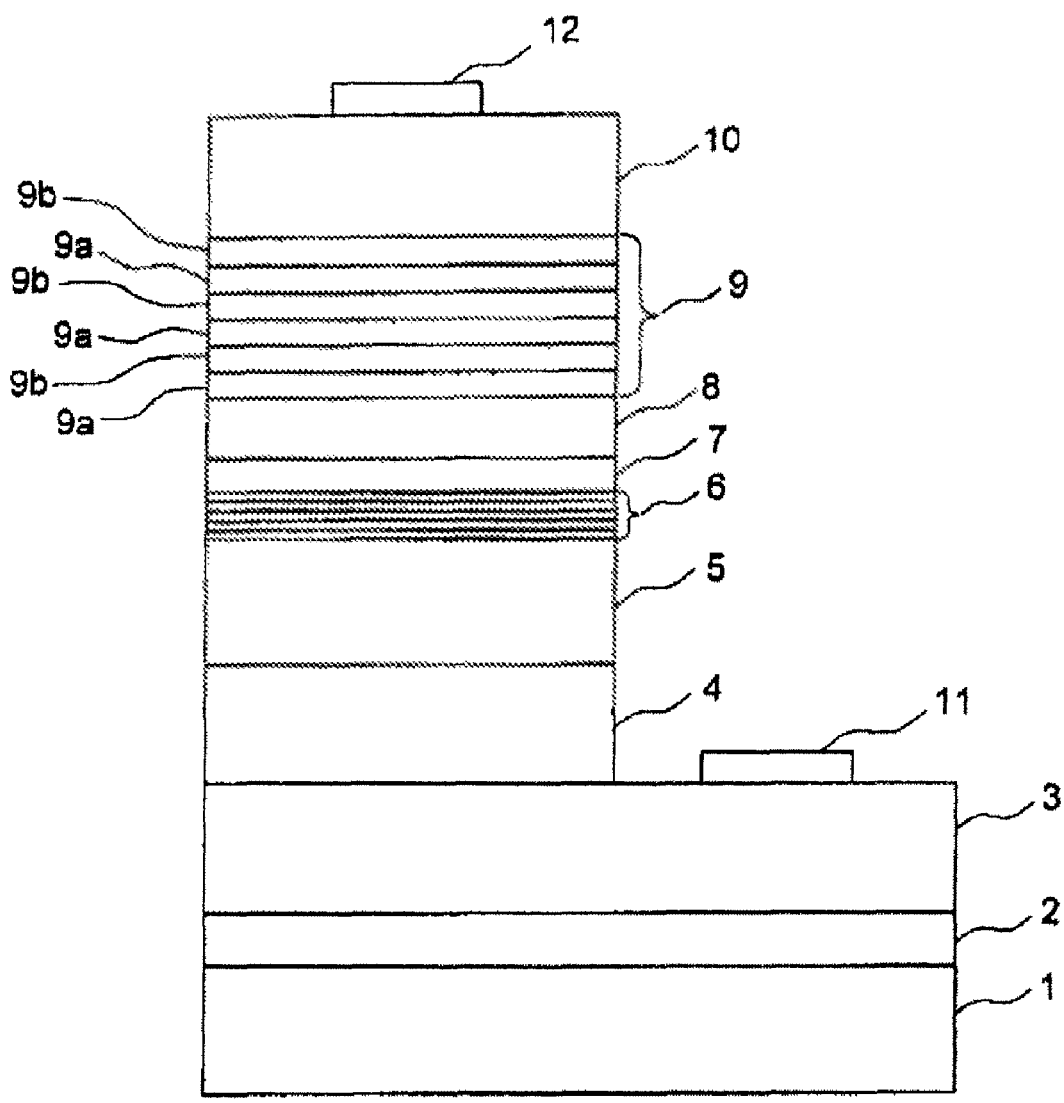
FIG. 1 is a cross-sectional drawing of an optoelectronic component comprising an inventive semiconductor layer structure with superlattice.

Disposed on the n-contact layer 3 are an n-cladding layer 4 and an n-waveguide layer 5. Applied to these is an active layer 6, followed by a barrier layer 7 and a p-waveguide layer 8. These are followed by a p-cladding layer implemented as a superlattice 9. The superlattice 9 contains the alternately stacked layers 9a of a first type a and layers 9b of a second type b.

Grown on the superlattice 9 is a p-contact layer 10. In the region on the right, the layer sequence is ablated by etching down to a surface of n-contact layer 3 facing away from the substrate, or masking was used to prevent this region from being built up at all. An n-contact 11 is applied to the exposed area of n-contact layer 3. A p-contact 12 is disposed on p-contact layer 10.

DETAILED DESCRIPTION

FIG. 1 is to be understood as a schematic drawing. In particular, the illustrated layer thicknesses are not true to scale.

The illustrated exemplary embodiment can be implemented, for example, on the basis of $In_xAl_yGa_{1-x-y}N$, $In_xAl_yGa_{1-x-y}As$, $In_xAl_yGa_{1-x-y}P$ or $In_xGa_{1-x}As_yN_{1-y}$ material systems in which $0 \leq x \leq 1$, $0 \leq y \leq 1$, $0 \leq x+y \leq 1$. The invention naturally is not limited to these material systems, but can also be constructed on the basis of other material systems, depending on the desired wavelength or other requirements.

The component illustrated in FIG. 1 represents a double heterostructure laser diode. Implementation with the $In_xAl_yGa_{1-x-y}N$ material system is described in more detail below by way of example. In such a case, sapphire can be used as the substrate 1 and n-doped GaN as the n-contact layer 3. Silicon (Si) is preferably used to n-dope the GaN layer. An aluminum nitride (AlN) layer is typically provided as a matching layer 2 between the sapphire substrate 1 and the GaN n-contact layer 3 to match the different lattice constants of this layer [sic].

Analogously, the p-contact layer 10 can be implemented in the form of a GaN layer p-doped with magnesium (Mg), in which case hole conduction induced by the magnesium impurities is activated in a known manner, e.g. by electron irradiation or heat treatment, after the growth of the layer. As the n- or p-contacts respectively 11 and 12, electrodes, made for example of aluminum or nickel, can be vapor-deposited on the corresponding n- or p-contact layers respectively 3 and 10. The necessary exposure of the n-contact layer 3 can be effected, for example, by means of a dry etch process performed in chlorine gas or by argon ion sputtering.

Alternatively, a conductive substrate such as, for example, gallium nitride (GaN) or silicon carbide (SiC) can be used instead of a nonconductive substrate 1. Under these circumstances, it may be possible to dispense with the n-contact layer 3 and, in some cases, e.g. if GaN is used, with the matching layer 2. The n-contact 11 can then be applied opposite the p-contact 12 on the side of the substrate facing away from the semiconductor layer structure, so that a vertically conductive semiconductor layer structure is formed.

Without limitation, FIG. 1 depicts an exemplary embodiment in which n-doped layers are applied to the substrate 1 first. An arrangement in which p-doped layers are arranged closer to the substrate 1 than the n-doped layers is also feasible. The two embodiments may have different properties in terms of charge carrier injection into the semiconductor layer structure. Either embodiment may prove advantageous in the individual case, depending on the desired properties.

The active layer 6 can be, for example, a single or multiple quantum layer structure, in which indium gallium nitride (InGaN) quantum layers are stacked alternately with AlGaN barrier layers.

In the context of the invention, the term "quantum layer" is to be understood as a layer dimensioned or structured such that a quantization of the charge carrier energy level that is essential for the production of radiation occurs, for example by confinement. In particular, the term "quantum layer" carries no implication or restriction as to the dimensionality of the quantization. The quantum layer can form a two-dimensional quantum well or contain structural elements of lower dimensionality, such as quantum wires or quantum dots or combinations of these structures.

In addition, it may also be contemplated to use a photoluminescence-active layer, e.g. a foreign-atom-doped InGaN layer, as active layer 6.

The layers surrounding the active layer 6 (n- and p-waveguide layers respectively 5 and 8, n-cladding layer 4, superlattice 9 as a p-cladding layer, and barrier layer 7) have a larger band gap than the active layer 6. This causes a concentration or confinement of charge carriers and/or fields on the active layer 6. The number of layers provided for this purpose is not fixed at the number shown in the figure (i.e., five layers), but is in principle arbitrary.

Furthermore, the layers surrounding the active layer 6 form a waveguide for the radiation generated in the active layer 6. Good waveguiding properties are obtained if the refractive index decreases away from the active layer 6 in a direction perpendicular thereto. Since GaN has a higher refractive index than AlGaN, the n- and p-waveguide layers respectively 5 and 8 that are disposed closer to the active layer 6 are implemented as GaN layers in the exemplary embodiment. n-cladding layer 4 and superlattice 9 as a p-cladding layer preferably contain aluminum.

On the side of active layer 6 facing toward the substrate 1 (i.e., the n-doped side), the waveguide layer 5 can be implemented for example as an Si-doped GaN layer and the cladding layer 4 as an Si-doped AlGaN layer. On the side of active layer 6 facing away from the substrate 1 (i.e., the p-doped side), analogously, a magnesium (Mg) doped GaN layer can be used as waveguide layer 8. To prevent the direct recombination of electrons diffusing out of the active layer 6 into the waveguide layer 8 with the holes that are present there, barrier layer 7 is additionally provided between the two layers. This can be implemented in the form of a preferably highly p-doped AlGaN layer, which is typically fashioned as much thinner than n- and p-waveguide layers respectively 5 and 8, n-cladding layer 4 or superlattice 9.

The p-side cladding layer is constituted by superlattice 9.

In the exemplary embodiment of FIG. 1, the superlattice 9 is formed by alternately arranged layers 9a of first type a and layers 9b of second type b. By way of example and for greater clarity of illustration, only three layers of each of the two different types a and b are illustrated in the figure. In actual reductions to practice of the invention, the superlattice usually has a larger number of layers, for example several tens of to a few hundred layers of any type. Typical layer thicknesses for an individual layer of the superlattice 9 are in the range of a few nm to several tens of nm, e.g. between 2 nm and 50 nm and preferably between 3 nm and 10 nm. Layers of the same type have nominally (i.e. within the precision of layer thickness control during or after the growth process) the same layer thickness. Nevertheless, the layers 9a of first type a and the layers 9b of second type b can differ in thickness from each other (asymmetrical superlattice) or be of the same thickness (symmetrical superlattice).

In the GaN-based material system, the superlattice 9, as a p-cladding layer, can be composed for example of alternating Mg-doped GaN layers and Mg-doped AlGaN layers. Due to the high activation energy of the Mg doping atoms, the electrical conductivity of p-doped layers is low. In addition, AlGaN has a larger band gap than GaN and, due to its lower doping efficiency, a lower conductivity. The doping efficiency specifies the concentration in which dopants are actually incorporated by the material and what fraction of the incorporated dopant atoms theoretically (i.e. ignoring temperature-induced filling effects) are actually able to contribute to conductivity. Doping efficiency depends, among other things, on which lattice sites or interlattice sites the doping atoms occupy.

According to the invention, layers 9a, 9b of the superlattice 9 contain dopants in predefined concentrations, with the superlattice 9 comprising layers 9a, 9b that are doped with different dopants.

Through the use of more highly and more efficiently dopable, and therefore more conductive, GaN layers, the superlattice 9 can, with an effectively equal refractive index, have a higher conductivity than a p-doped pure AlGaN cladding layer. An effectively equal refractive index can be obtained by having the aluminum content of the AlGaN layers used in the superlattice 9 be higher than that of the pure AlGaN cladding layer.

Instead of a GaN/AlGaN superlattice 9, a superlattice 9 is also conceivable in which $Al_xGa_{1-x}N/Al_yGa_{1-y}N$ layers, where $0 \leq x$, $y \leq 1$ and $x \neq y$, are alternately stacked. It is also possible to use In instead of Al in all or some layers of the superlattice 9. Superlattices 9 in which three or more different layer types are alternately stacked are also conceivable.

It is further conceivable to use a superlattice for the n-doped AlGaN cladding layer 4. Given the generally higher conductivity of n-doped layers, the advantage in this case does not lie primarily in higher vertical conductivity. However, advantages are to be gained from a potential reduction of the strains induced in the active layer 6. A further advantage, which is relevant particularly in the case of lateral current injection, derives from the increased lateral electrical conductivity of a superlattice.

The superlattice 9 may, for example due to its Al content, cause strains in the active layer 6. Granted, these strains may be reduced by the GaN waveguide layer 8 located between the superlattice 9 and the active layer 6, but not necessarily to a sufficient extent. This is especially true because the thickness of the GaN waveguide layer 8, on which any reduction of induced strain depends, is predefined on the basis of the requirements placed on the optical waveguide properties.

According to the invention, the content of Al and also In, which also has effects on induced strain in the active layer 6, is not constant within the layers of at least one type in the superlattice 9, thus making it possible to adapt the superlattice 9 in the best possible manner to the countervailing requirements of good waveguiding and low induced strain. Detailed descriptions of corresponding superlattices, in which the content of at least one element (here Al and/or In) varies within layers of one or more types in the superlattice, are provided below in connection with the exemplary embodiments of FIGS. 2 to 5.

FIGS. 2 to 5 are graphs relating to different respective exemplary embodiments of a superlattice in which the Al content $c_{Al}$ and in some cases the In content $c_{In}$, in percent (ordinate), are plotted against a vertical position z within the superlattice of a semiconductor layer structure (abscissa). The side of the superlattice facing toward an active layer is selected as the zero point for the vertical position z within the superlattice. The active layer is therefore located to the left of the illustrated region of the superlattice, at negative values of the vertical position z.

The superlattice is formed in each case by a multiplicity of alternately stacked layers of different types a, b and in some cases also c, d, wherein the layer of the superlattice beginning at z=0 and located closest to the active layer is, by definition, of type a.

Figure 2A:
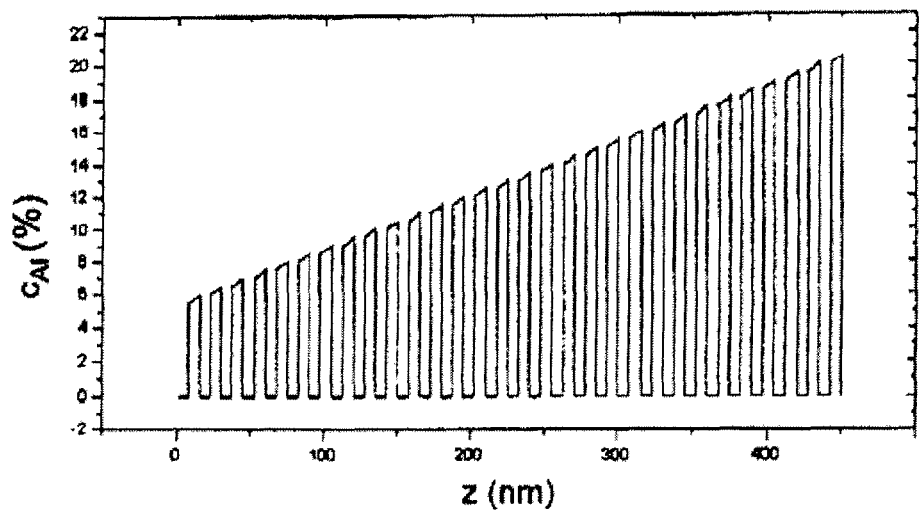
FIGS. 2-5 are schematic representations of the content of one or various elements as a function of vertical position in a superlattice in various exemplary embodiments of a semiconductor layer structure with superlattice.

Represented in FIG. 2a is a superlattice of a semiconductor layer structure in which layers of two different types a, b are alternately stacked. Provided are 30 layers of each layer type a, b, with a layer thickness of 7.5 nm each, making the superlattice a total of 450 nm thick. The layers of type a are GaN layers. The layers of type b are AlGaN layers, with the Al content $c_{Al}$ of these layers increasing linearly by about 5% to 20% from layer to layer and the Al content $c_{Al}$ being graded within the individual AlGaN layers. The average Al content of the AlGaN layers is therefore 12.5%. Here, the layer facing the active layer has the lowest Al content $c_{Al}$. Compared to a GaN/AlGaN superlattice, in which the AlGaN layers have an average Al content of 12.5%, the superlattice of FIG. 2a causes less strain in the active layer, since the lattice structure and lattice constants in the superlattice advantageously vary with the Al content as it decreases in the direction of the active layer. Moreover, an Al content that decreases in the direction of the active layer may be preferable, since energy barriers to the active layer are lowered and the heterostructure interface thus becomes less of an influence. A graded Al content within a layer can boost the conduction-enhancing effect of a superlattice.

A further advantage of a superlattice in which the Al content $c_{Al}$ varies linearly or, more generally, in an irreversible and unequivocal manner, with the position of a layer in the superlattice is gained in the component manufacturing process. For contact application or waveguiding, it is often necessary to make ridges in a semiconductor structure. In many material systems, wet chemical etching is used in combination with so-called etch stop layers to ensure a defined depth for the ridges. The AlGaN material system is resistant to wet chemical etching processes, however, so only the less material-selective dry etch process can normally be used in that case. If the Al content of the ablated material is measured during the etching process, an in situ depth determination can be made regarding the relationship between the Al content $c_{Al}$ of the layers in the superlattice and their position in the superlattice. The Al content of the ablated material can be measured by mass spectrometry, for example.

Figure 2B:
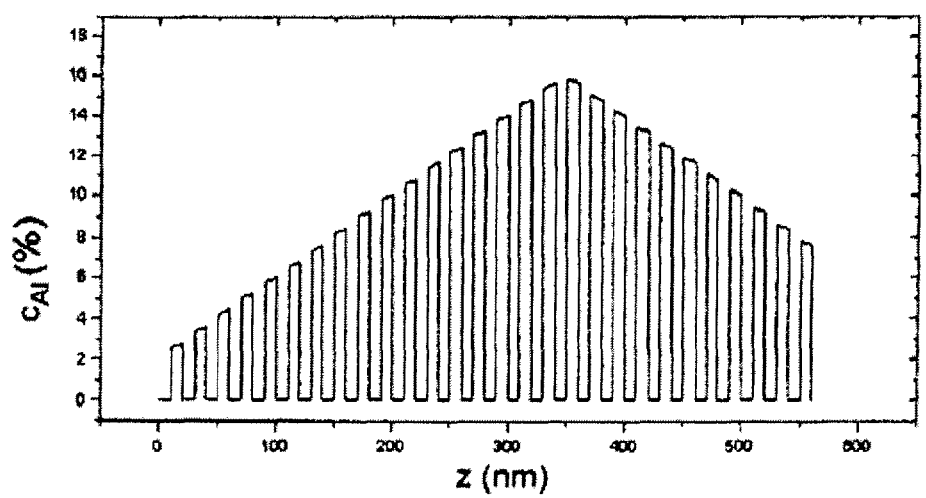

FIG. 2b shows an exemplary embodiment of a GaN/AlGaN superlattice in which the Al content $c_{Al}$ in the AlGaN layers within the superlattice exhibits a maximum of about 17% and decreases to both sides. Strains to both sides of the superlattice are reduced in this way; in the illustrated example, the maximum is not reached exactly in the center of the superlattice, and the layer closest to an active layer has a lower Al content $c_{Al}$ than the layer farthest from the active layer.

Generalized, the variation of the Al content $c_{Al}$ within a superlattice can be described by an (envelope) function that gives the Al content $c_{Al}$ of a layer as a function of the position of that layer. For this purpose, either a common function can be defined for all layer types a, b, etc., or an individual function can be defined for each layer type. Any arbitrary function curve is theoretically possible, including a nonlinear curve, for example.

FIG. 3 represents exemplary embodiments of superlattices of a semiconductor layer structure in which layers of three different types a, b and c are alternately stacked.

Figure 3A:
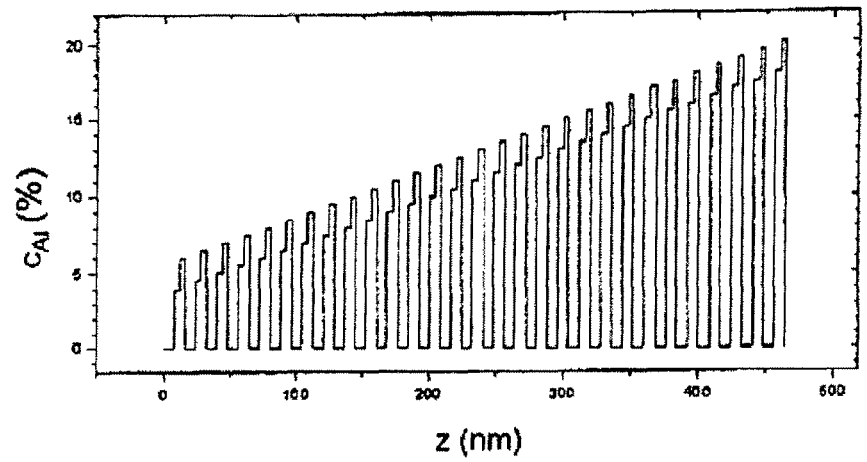

In the example of FIG. 3a, the layers of type a are GaN layers whose composition is constant over the superlattice. The layers of layer types b and c are AlGaN layers whose Al content $c_{Al}$ varies within the superlattice. Both for layers of type b and for layers of type c, the Al content $c_{Al}$ increases linearly with increasing vertical position z of the layer, but each layer of type c contains 2% more Al than the layer of type b directly adjacent to it. Layers of types b and c are also only half as thick as layers of type a. The structure can also, in a way, be viewed as a GaN/AlGaN superlattice having only two layer types, of which the AlGaN layers are graded according to a step function. As mentioned previously hereinabove, a graded Al content within a layer can boost the conduction-enhancing effect of a superlattice.

Figure 3B:
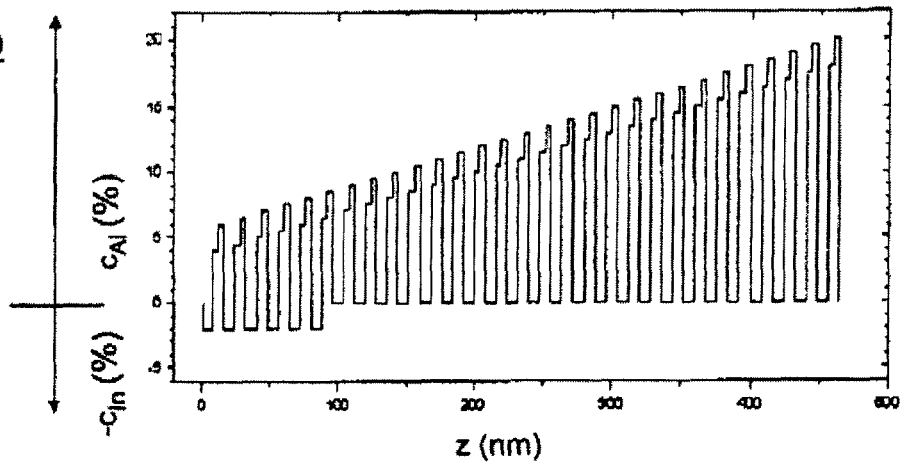
Figure 3C:
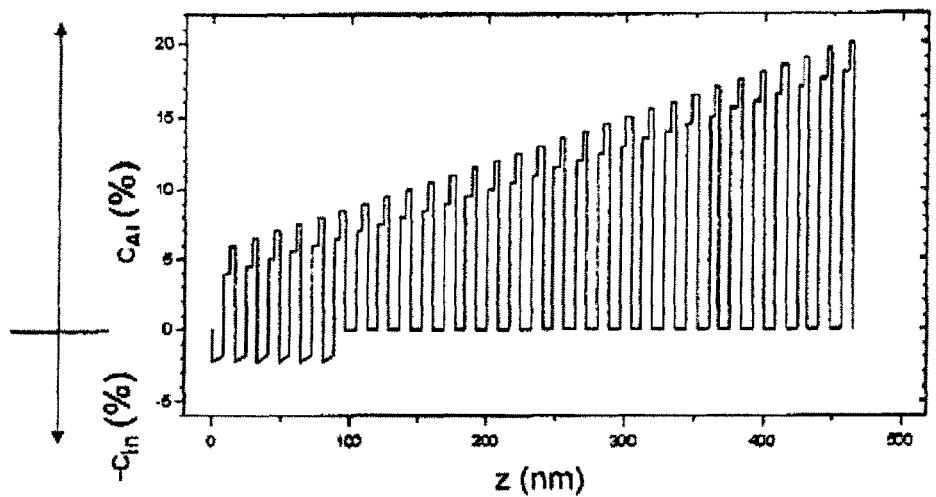
Figure 3D:
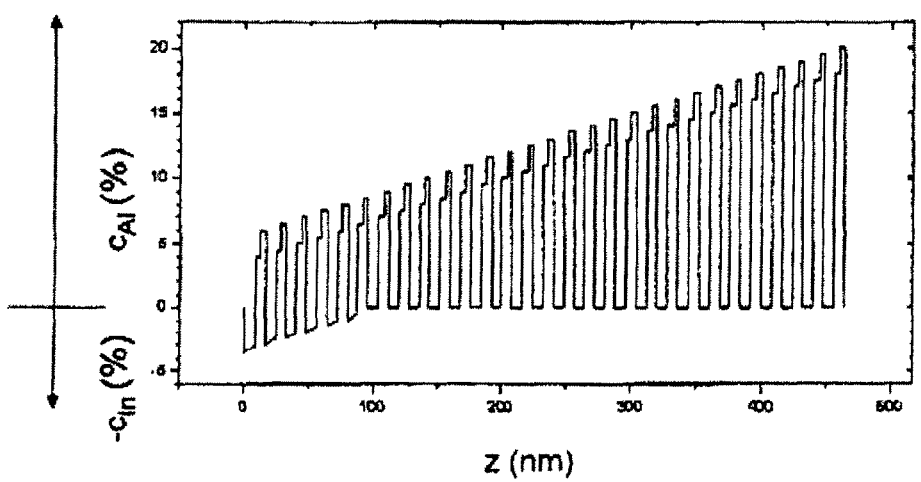

In the examples illustrated in FIGS. 3b-d, the AlGaN layers of types b and c are also implemented as in the example of FIG. 3a. However, the layers of type a provided here are InGaN layers with a variable In content $c_{In}$. In the examples of FIGS. 3b and 3c, the In content $c_{In}$ follows a step function, in the first case with an In content that remains constant within a layer, and in the second with a graded In content. In the example of FIG. 3d, the In content $c_{In}$ decreases linearly in six layers and is zero for the remaining layers. The use of InGaN layers instead of pure GaN layers may cause a reduction of the strain induced in the active layer, but it may also be detrimental to waveguiding by the superlattice, since a higher In content increases the refractive index of the superlattice, which results in a smaller refractive index contrast with an adjacent waveguide layer. The non-constant In content $c_{In}$ increasing in the direction of the active layer strengthens the positive effects of InGaN layers in the superlattice over the detrimental effects.

Figure 4:
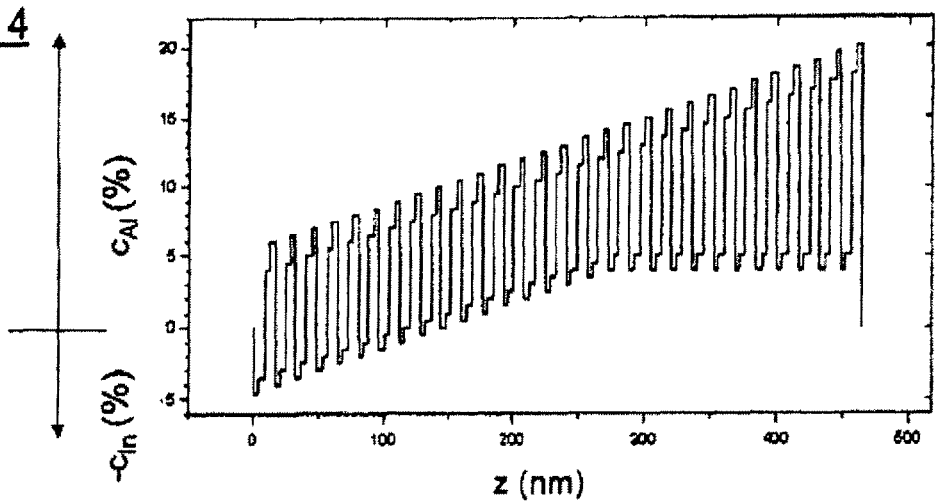

FIG. 4 shows an exemplary embodiment of a superlattice of a semiconductor layer structure in which layers of four different types a, b, c and d are alternately stacked. The layers of c and d, like layers b and c from FIG. 3, are AlGaN layers whose Al content $c_{Al}$ within the superlattice increases linearly within the layers of one type, the Al content $c_{Al}$ of each layer of type d being about 2% higher than that of the adjacent layer of type c. The layers of types a and b are layers of the composition $In_xAl_yGa_zN_{(1-x-y-z)}$, where x=0 if y>0 and y=0 if x>0. In and Al thus are not present simultaneously in one layer in these exemplary embodiments. It is, of course, theoretically possible to include layers that contain In and Al. The In content $c_{In}$, i.e. the coefficient x, initially decreases linearly in the first nine layers of type a and the first eight layers of type b (counting from an active layer outward) and is zero in the following layers. Conversely, the Al content $c_{Al}$, i.e. the coefficient y, is zero in the first eight or nine layers (z between 0 and 130 nm) and then increases linearly for the following middle layers (z between 130 and 270 nm), to remain at a constant level for the remaining layers (z>270 nm). In each layer of type a in this arrangement, the In content $c_{In}$ is higher and the Al content $c_{Al}$ is lower than in the respective adjacent layer of type b. The structure can also, in a way, be viewed as a superlattice having only two layer types, of which the AlGaN layers are graded according to a step function. The advantages with regard to induced strain that are afforded by a lower Al content $c_{Al}$ and a higher In content $c_{In}$ in layers that are directly or indirectly adjacent the active layer are combined in this embodiment with the positive effects of a (stepwise) graded Al content on the conductivity of the superlattice.

Illustrated in FIG. 5 are exemplary embodiments of AlGaN/AlGaN superlattices of a semiconductor layer structure. The layers of both types, a and b, are AlGaN layers in which the Al content $c_{Al}$ varies within the superlattice. Let the Al content $c_{Al}$ dependent on the vertical position z of a layer of type a be described by a first function and the Al content $c_{Al}$ of a layer of type b by a second function. In both of the examples illustrated in FIG. 5, the first function is unequal to the second. Directly adjacent layers therefore differ in terms of Al content $c_{Al}$ and thus with regard to composition. This does not mean, however, that a layer of type a cannot have the same composition as a layer of type b.

Figure 5A:
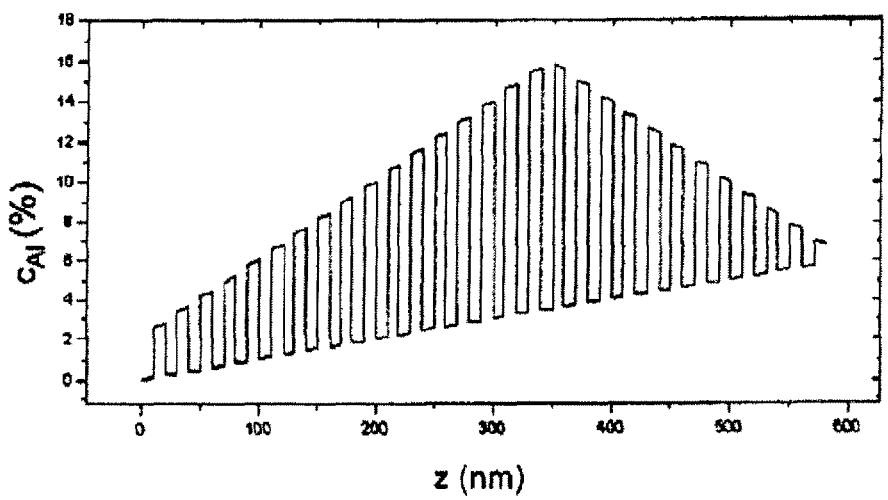
Figure 5B:
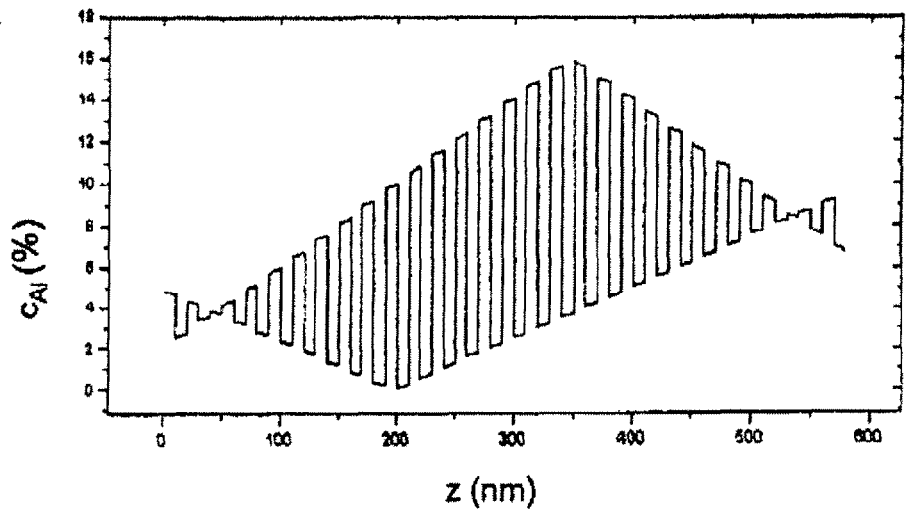

In the example of FIG. 5a, the first function is a function that increases linearly with vertical position z. The second function initially shows a linear increase to a maximum at about z=350 nm and then decreases again at higher values of z. In the example of FIG. 5b, the two functions both have linearly increasing and linearly decreasing regions, but differ with respect to the increases in the functions and the positions of the maximum (type b) and minimum (type a) of the Al content $c_{Al}$.

In the exemplary embodiments of FIG. 5, the varying Al content $c_{Al}$ of both layer types a and b results in a superlattice that permits good waveguiding due to its high average Al content and yet keeps strains on the active layer reasonably low by virtue of the Al content $c_{Al}$ decreasing in the direction of the active layer.

The description of the invention with reference to the described exemplary embodiments is not to be understood as restricting the invention thereto. Rather, the invention also encompasses combination with all other features recited in the exemplary embodiments and the rest of the description, even if such combination is not the subject matter of a claim.

The invention claimed is:

1. A semiconductor layer structure, comprising a superlattice composed of stacked layers of a first and at least one second type, wherein said layers of said first type and of said at least one second type are III-V compound semiconductors, adjacent layers of different types in said superlattice differ in composition with respect to at least one element, at least two layers of the same type in said superlattice have a different content of at least one element, the content of at least one element is graded within a said layer of said superlattice, and said layers of said superlattice contain dopants in predefined concentrations, with said superlattice comprising layers that are doped with different dopants.

2. The semiconductor layer structure as in claim 1, wherein said superlattice comprises alternately stacked $In_xAl_yGa_{1-x-y}N$ and $In_wAl_zGa_{1-w-z}N$ layers where $0 \leq x,y,w,z \leq 1$ and $x+y \leq 1$ and $w+z \leq 1$.

3. The semiconductor layer structure as in claim 1, wherein said superlattice comprises alternately stacked $In_xAl_yGa_{1-x-y}P$ and $In_wAl_zGa_{1-w-z}P$ layers where $0 \leq x,y,w,z \leq 1$ or alternately stacked $In_xAl_yGa_{1-x-y}As$ and $In_wAl_zGa_{1-w-z}As$ layers where $0 \leq x,y,w,z \leq 1$ and $x+y \leq 1$ and $w+z \leq 1$.

4. The semiconductor layer structure as in claim 1, wherein the individual said layers of said superlattice are each assigned a vertical position within said semiconductor layer structure, and the content of at least one element in a layer is dependent in a predetermined manner on the vertical position of that layer within said semiconductor layer structure.

5. The semiconductor layer structure as in claim 4, wherein said dependence of the content of at least one element on said vertical position is defined by a common function for all said layers of said superlattice.

6. The semiconductor layer structure as in claim 4, wherein said dependence of the content of at least one element on said vertical position is defined by a first function for layers of said first type and by at least one second function for layers of said at least one second type.

7. The semiconductor layer structure as in claim 5, wherein said first and/or said at least one second and/or said common function is a step function or a monotonously rising/falling function or a linear function or a polynomial function or an exponential function or a logarithmic function or a periodic function or a superposition of the aforesaid functions or contains fractions of one of said functions.

8. The semiconductor layer structure as in claim 1, wherein the content of at least one element is constant within a said layer of said superlattice.

9. The semiconductor layer structure as in claim 1, wherein all said layers have the same thickness.

10. The semiconductor layer structure as in claim 1, wherein said layers of different types have different thicknesses.

* * * * *